United States Patent
Raja et al.

(10) Patent No.: US 10,659,063 B2
(45) Date of Patent: May 19, 2020

(54) ADAPTIVE VOLTAGE FREQUENCY SCALING FOR OPTIMAL POWER EFFICIENCY

(71) Applicant: NVIDIA CORPORATION, Santa Clara, CA (US)

(72) Inventors: Tezaswi Raja, San Jose, CA (US); Ben Faulkner, San Jose, CA (US); Divya Ramakrishnan, San Jose, CA (US); Tao Liu, Saratoga, CA (US); Veeramani V, Bangalore (IN); Ayon Dey, Bangalore (IN); Javid Aziz, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 57 days.

(21) Appl. No.: 15/340,901

(22) Filed: Nov. 1, 2016

(65) Prior Publication Data
US 2018/0123604 A1    May 3, 2018

(51) Int. Cl.
*H03L 1/00*  (2006.01)
*H03L 5/00*  (2006.01)
*H03L 7/099*  (2006.01)
*H03L 7/00*  (2006.01)

(52) U.S. Cl.
CPC ............. *H03L 7/099* (2013.01); *H03L 1/00* (2013.01); *H03L 5/00* (2013.01); *H03L 7/00* (2013.01); *H03L 2207/05* (2013.01)

(58) Field of Classification Search
CPC ..... G05F 1/10; G05F 3/02; G06F 1/08; G06F 1/3296; H03L 1/00; H03L 5/00
See application file for complete search history.

(56) References Cited

U.S. PATENT DOCUMENTS

| | | | | |
|---|---|---|---|---|
| 3,763,492 A | * | 10/1973 | Easton | G01S 11/08 342/458 |
| 4,387,347 A | * | 6/1983 | Pierrot | H03L 7/04 327/101 |
| 4,890,071 A | * | 12/1989 | Curtis | H03C 3/0925 331/11 |
| 5,032,800 A | * | 7/1991 | Galani | H03B 5/1882 331/1 R |

(Continued)

*Primary Examiner* — Levi Gannon
(74) *Attorney, Agent, or Firm* — Zilka-Kotab, P.C.

(57) ABSTRACT

Aspects of the present invention are directed to techniques for improving the efficiency of power supply schemes by continuously and adaptively scaling voltage and frequency levels in an integrated circuit based on measured conditions in real-time, without resorting to a reliance on excessive pre-computed margins typical of conventional schemes. Embodiments of the present invention employ a self-tuning dynamic voltage control oscillator (or other similar clock signal generator) that sets the frequency for components in the integrated circuit. When a requested frequency exceeds a maximum allowed frequency for a given voltage level (accounting for other age and temperature related conditions), a look-up table is dynamically referenced to determine a new voltage level that is sufficient to safely and efficiently generate the requested frequency. The look-up table continuously receives updates on the operating conditions, and new voltage requests can be generated dynamically as necessary based on the system's current needs.

18 Claims, 4 Drawing Sheets

(56) References Cited

U.S. PATENT DOCUMENTS

| | | | |
|---|---|---|---|
| 5,150,080 A * | 9/1992 | Bianchini | H03B 5/1864 331/117 D |
| 6,311,287 B1 * | 10/2001 | Dischler | G06F 1/206 713/601 |
| 7,100,061 B2 * | 8/2006 | Halepete | G06F 1/08 713/322 |
| 7,119,604 B2 | 10/2006 | Chih | |
| 7,120,804 B2 | 10/2006 | Tschanz et al. | |
| 7,129,771 B1 | 10/2006 | Chen | |
| 7,228,242 B2 | 6/2007 | Read et al. | |
| 7,362,165 B1 | 4/2008 | Chen | |
| 7,562,233 B1 * | 7/2009 | Sheng | G06F 1/3203 713/300 |
| 7,774,625 B1 * | 8/2010 | Sheng | G06F 1/3203 713/300 |
| 9,317,048 B2 * | 4/2016 | Kuang | G05F 1/12 |
| 2007/0156370 A1 * | 7/2007 | White | G06F 1/206 702/132 |
| 2007/0250219 A1 * | 10/2007 | Gaskins | G06F 1/08 700/299 |
| 2011/0249525 A1 * | 10/2011 | Haass | G01R 31/31704 365/233.1 |
| 2012/0179416 A1 * | 7/2012 | Anderson | G06F 1/203 702/130 |
| 2013/0138977 A1 * | 5/2013 | Herman | G06F 1/3206 713/300 |
| 2015/0061744 A1 * | 3/2015 | Bulzacchelli | G05F 1/59 327/306 |
| 2016/0179164 A1 * | 6/2016 | Park | G06F 1/324 713/322 |
| 2017/0083383 A1 * | 3/2017 | Rider | G06F 9/5094 |

* cited by examiner

Exemplary Computer System 400

ADAPTIVE VOLTAGE FREQUENCY SCALING FOR OPTIMAL POWER EFFICIENCY

FIELD OF THE INVENTION

Embodiments of the present invention refer generally to techniques for improving the power optimization of integrated circuits. More specifically, embodiments of the invention are directed to a solution for continuously adapting operating parameters during process variations.

BACKGROUND OF THE INVENTION

In computer architecture, Dynamic Voltage and Frequency Scaling (DVFS) is a power optimization technique in which a processor or other integrated circuit component can be made to work at different frequency and voltage settings, depending on real-time performance and/or power requirements. Conventional DVFS solutions are characterized by the ability to adjust a frequency and voltage of a processor or microprocessor dynamically, either to conserve or optimize power or to reduce the amount of heat generated by the chip. In traditional DVFS schemes, manufacturers often impose safety limits to one or more settings during operation. For example, for any given voltage level, a maximum frequency that corresponds to a safe operating range may be imposed to limit the potential for component malfunction and/or prevent the risk of premature failure—due to overheating, for example.

Typically, these limits are calculated with built-in margins that account for process variations that may arise from a variety of different sources such as integrated circuit process variations, random noise (e.g., voltage fluctuations), temperature variations, age-related degradation, and/or voltage regulator tolerances, etc. While reasonably effective to prevent overheating due to excessive voltages or operating frequencies, these margins also decrease the overall power efficiency of the chip, since the margins are often over-budgeted to account for worst-case scenarios. For instance, software may request a particular clock frequency for a microprocessor and a larger voltage is assigned than is optimally required to operate the microprocessor at that frequency, to account for the margin.

Recently, new solutions have been introduced that attempt to solve this issue. One such proposed solution uses a noise-aware phase locked loop (NAPLL) that accounts for noise and voltage regulator margins of an integrated circuit but fails to account for any other factors that potentially contribute to inefficiencies. As such, margins must still be built-in to account for those factors that decrease the power efficiency of the integrated circuit, or else expose users to the risks inherent to overheating. Another proposed solution is to use a closed loop DVFS scheme that uses a digital ring oscillator as the clock generator. However, digital ring oscillators can themselves suffer from process variations and need additional margining. Each of these schemes also suffer from a lack of scalability, since the number of clock domains that are part of the same voltage rail is inherently limited.

SUMMARY OF THE INVENTION

This Summary is provided to introduce a selection of concepts in a simplified form that are further described below in the Detailed Description. This Summary is not intended to identify key features or essential features of the invention, nor is it intended to be used to limit the scope of the invention.

Embodiments of the present invention are directed to techniques for improving the efficiency of integrated circuit power consumption schemes by continuously and adaptively scaling voltage and frequency levels in an integrated circuit based on measured conditions in real-time, without resorting to a reliance on excessive pre-computed margins typical of conventional schemes. Embodiments of the present invention employ a self-tuning dynamic voltage control oscillator (or other similar clock signal generator) that sets the frequency for components in the integrated circuit based on a voltage input. Among other inputs used to set voltage level, real-time aging and temperature sensors are used.

When a requested frequency exceeds a maximum allowed frequency for a given voltage level (accounting for other age and temperature related conditions), a look-up table is dynamically referenced to determine a new frequency that the current voltage is able to safely support. According to one or more embodiments, the look-up table continuously receives updates on the operating conditions—including subsequent fluctuations in voltage due to noise and process variation—and new voltage requests can be generated dynamically as necessary based on the system's current needs. The look-up table receives temperature and aging inputs that are updated in real-time.

According to one embodiment of the present invention, a system is provided that includes a clock generator or a noise-aware frequency locked loop (NAFLL) that generates a clock by self-tuning a ring oscillator. This clock generator provides noise immunity by reducing the frequency in the event of noise. A hardware look-up-table is also included that determines the maximum frequency of the integrated circuit (or other component) based on feedback from real-time voltage, temperature, and aging sensors. Since the frequency during operation is based on real-time sensor measurements, the need for pre-built in margins is eliminated. According to one or more embodiments, a voltage requestor is also included that computes the error between the maximum frequency allowed for the current voltage, and a frequency requested (e.g., from a software application), and converts the difference into a new voltage request. Looping the voltage with the frequency repeatedly until the frequency error approaches zero ensures that the voltage in the integrated circuit is the minimum required to achieve the requested frequency, thereby eliminating inefficiencies in managing and optimizing power.

According to another embodiment, a method is provided to adaptively scale voltage and frequency for optimal power efficiency in an integrated circuit. In one or more embodiments, a software application requests a frequency of operation based on performance requirements. If the software requested frequency is different from the maximum allowed frequency (as referenced from a look-up table), the voltage is controlled by a voltage regulator until the frequency in the integrated circuit is the same as that requested by the software application. While voltage is being changed in the integrated circuit, the look-up table constantly updates the frequency from the clock generator to make sure the system always operates at the maximum allowed frequency for that voltage.

According to yet another embodiment of the present invention, a method is provided to generate the frequency request. In one or more embodiments, after receiving a frequency request from a software application, the requested frequency is compared (e.g., in a comparator) with the maximum allowed frequency corresponding to the current voltage in the system. If a difference is determined, the frequency difference is converted using a pre-determined function into a difference in voltage. Thereafter, a new voltage request is generated to raise (or drop) the voltage in the level to a suitable level sufficient to power the system at the requested frequency. This frequency driven voltage adjustment is performed continuously until the frequency error is at or near zero.

By providing a self-tuning clock generator that reads voltage as input, fluctuations in voltage (due to process variations and software requests) can be adaptively and instantly accommodated. As a result, inefficient margining can be avoided to increase the power efficiency of an integrated circuit.

BRIEF DESCRIPTION OF THE DRAWINGS

The accompanying drawings are incorporated in and form a part of this specification. The drawings illustrate embodiments. Together with the description, the drawings serve to explain the principles of the embodiments.

DETAILED DESCRIPTION

Figure 1:
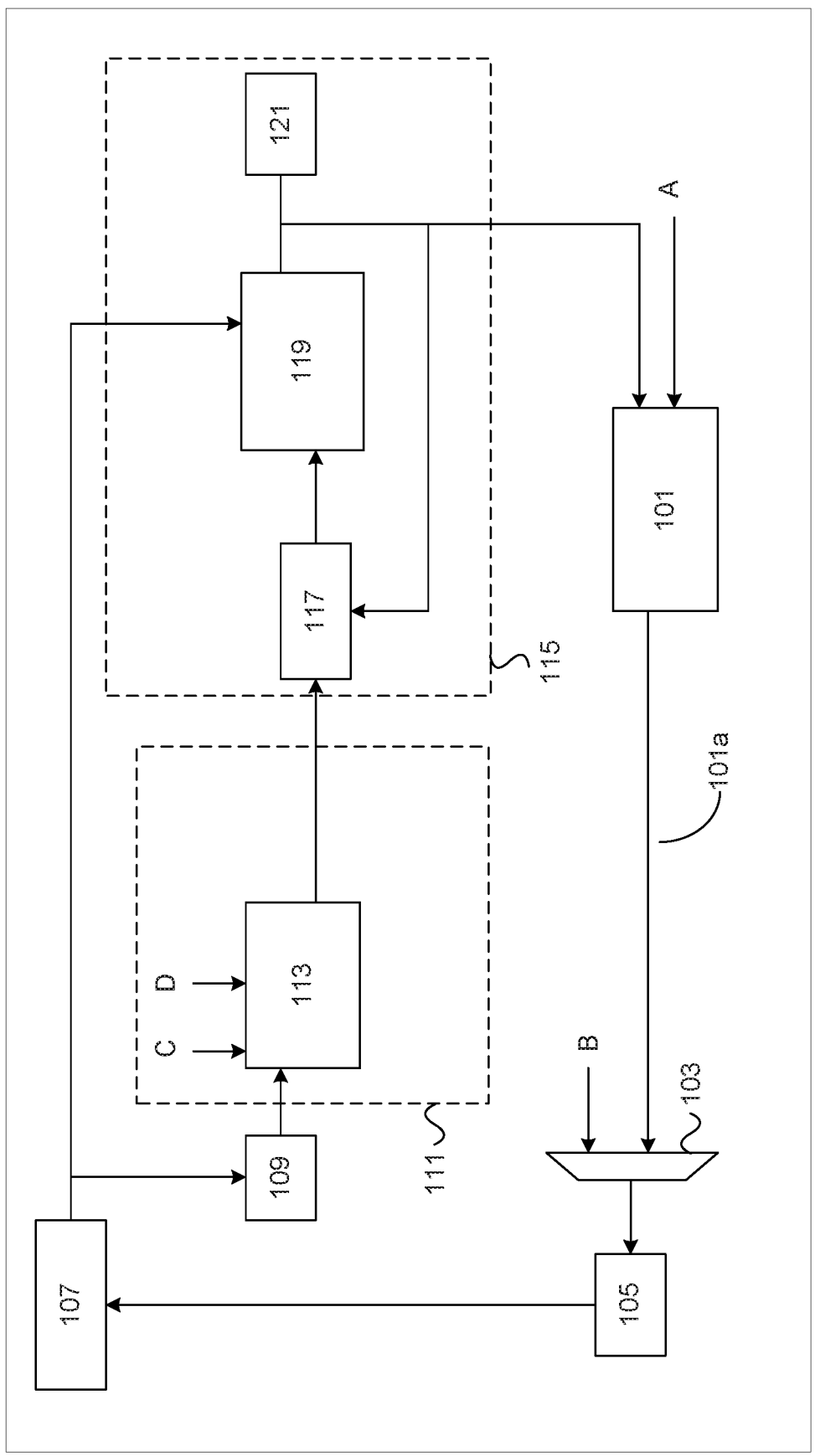
FIG. 1 depicts a schematic of an exemplary integrated circuit, in accordance with various embodiments of the present invention.

Reference will now be made in detail to the preferred embodiments of the invention, a method and system for the use of a shield can of a mobile computing device with improved heat management capability, examples of which are illustrated in the accompanying drawings. While the invention will be described in conjunction with the preferred embodiments, it will be understood that they are not intended to be limit to these embodiments. On the contrary, the invention is intended to cover alternatives, modifications and equivalents, which may be included within the spirit and scope as defined by the appended claims.

Furthermore, in the following detailed descriptions of embodiments of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Embodiments of the invention are directed to novel solutions for improving power optimization in dynamic and adaptive voltage and frequency scaling of integrated circuits.

Adaptive Voltage Frequency Scaling

FIG. 1 depicts a diagram 100 of an exemplary integrated circuit with adaptive dynamic voltage and frequency scaling, in accordance with various embodiments of the present invention. As depicted in FIG. 1, the integrated circuit includes a voltage requestor 101, a pulse-width modulator 105, a voltage regulator 107, one or more sensors 109, a look-up table 111, and a clock signal generator 115. In one or more embodiments, the integrated circuit may be implemented as, for example, one or more microprocessors or processing cores in a video card or motherboard of a computing device. Other examples of integrated circuits in which the present invention may be implemented include application-specific integrated circuits (ASICs), memory chips, battery-operated devices, and generally any device or integrated circuit in which dynamic scaling of voltage and frequency performed adaptively may be desirable.

In one or more embodiments, the voltage requestor 101 may be implemented as a comparator and a proportional-integral-derivative (PID) controller that takes in as input a clock signal at a given frequency from the clock signal generator 115, along with an input (A). In one or more embodiments, input A consists of a frequency request, such as a frequency request generated by a software application executed at least partially by the integrated circuit. The comparator compares the frequency from the clock signal generator 115 (the current operating frequency) with the requested frequency of input A to determine whether the frequencies are different. When a difference exists, the PID controller calculates the degree of difference. The voltage requestor 101 then generates a new voltage request 101a that corresponds to the calculated difference in frequencies.

In one or more embodiments, the current operating voltage is the minimum voltage sufficient to power the clock signal generator for the current operating frequency within safe operating limits, accounting for variations in process.

Thus, when the frequency requested (e.g., by a software application such as a device's BIOS) is less than the current operating frequency, a new voltage request 101a is generated that is lower than the current operating voltage, and would be the minimum voltage required to achieve the desired frequency, again accounting for process variation factors and within safe operating limits. Likewise, when the frequency requested is higher than the current operating frequency, a new voltage request 101a is generated that is correspondingly higher than the current operating voltage.

The voltage request output by the voltage requestor 101 is received as input in a pulse-width modulator 105 which controls the voltage requests received by the voltage regulator 107. In one or more embodiments, the pulse-width modulator 105 also consists of a multiplexer 103 positioned between the pulse-width modulator 105 and the voltage requestor 101. The multiplexer 103 receives the voltage request from the voltage requestor 101 and, if necessary, a second voltage request as input (e.g., input B). In one or more embodiments, the second voltage request may be provided by a software application. The pulse-width modulator 105 measures the two requested voltages, and forwards the request with the highest voltage to the voltage regulator 107.

In one or more embodiments, the voltage regulator 107 may be implemented with a power management integrated circuit (PMIC), which collectively controls the flow of electrical power in the integrated circuit. The voltage regulator 107 receives the voltage request from the voltage requestor 101 (via pulse-width modulator 105), and adjusts the flow of electrical power to provide the requested voltage. In one or more embodiments, the supply voltage from the voltage regulator is provided directly to the clock signal generator 115. According to still further embodiments, the flow of electrical power is received in a dynamic voltage control oscillator (DVCO) 119 that automatically generates a clock signal with a frequency corresponding to the input voltage.

The flow of electrical power is also received from the voltage regulator 107 in an analog to digital converter (ADC) 109, which filters low frequency-voltage noise and measures the voltage level provided and outputs the measurement data into a look-up table 111. In one or more embodiments, the ADC is configured to constantly measure the current operating voltage, to detect small changes in voltage due to noise, and to output the measured voltage to the look-up table 111. As depicted in FIG. 1, the look-up table (LUT) 111 includes a specific hardware component look-up table 113. In addition to the voltage measurement data provided by the ADC 109, the LUT 111 may also receive as input process variation and current operating condition data measured by one or more sensors. The LUT advantageously determines the chip's maximum frequency based on real-time feedback from the voltage, temperature, and aging sensors. Since the frequency is based on real-time measurements of sensors, the need for built-in margins is therefore eliminated.

For example, a temperature sensor may provide real-time temperature data as input C, and a dedicated aging sensor may provide real-time age and/or age-related degradation data as input D. In one or more embodiments, the hardware look-up table 113 includes one or more voltage-frequency (VF) curves that account for specific process variation and operating conditions (e.g., temperature, age). The data from one or more of the sensors (e.g., voltage, temperature, and age) is used as input in the hardware look-up table 113 to reference a maximum frequency allowed at the voltage, a corresponding frequency request is then determined and forwarded to the clock signal generator 115.

In one or more embodiments, the clock signal generator 115 may be implemented as a noise-aware frequency locked loop (NAFLL) that includes a second comparator/PID controller 117, and a DVCO 119. The second comparator and PID controller 117 receives the frequency request from the LUT 111 that corresponds to the voltage supplied by the voltage regulator 107 adjusted to account for temperature, age, and other process variations, and outputs an adjusted frequency request to the DVCO 119, which becomes the subsequent operating frequency. In one or more embodiments, the DVCO 119 may be implemented as a self-tuning ring oscillator. As such, when the voltage goes down, the DVCO slows down immediately. Likewise, when the voltage increases, the DVCO generates a signal at a higher frequency.

Since the DVCO is directly connected to the supply voltage, immunity from noise events is provided by reducing the frequency in response to those events. The ensuing frequency output from the clock signal generator 115 is the frequency used to operate the integrated circuit until a subsequent frequency is requested (e.g., by software) that is determined to be different from the operating frequency, or until process variations and operating conditions change to the extent that the voltage level is compromised or altered.

According to one or more embodiments, while voltage is changed in the integrated circuit, the LUT 111 is constantly updating the frequency from the clock signal generator 115 to ensure the chip or component always operates at the maximum allowed frequency for that voltage. In cases where voltage is limited (e.g., by a Vmin or Vmax) or by other units that share a voltage rail with the integrated circuit, one or more pulse skippers 121 may be engaged to adjust the effective frequency to approximate the frequency requested by a software application, so the integrated circuit never operates in a higher frequency than is required.

Figure 2:
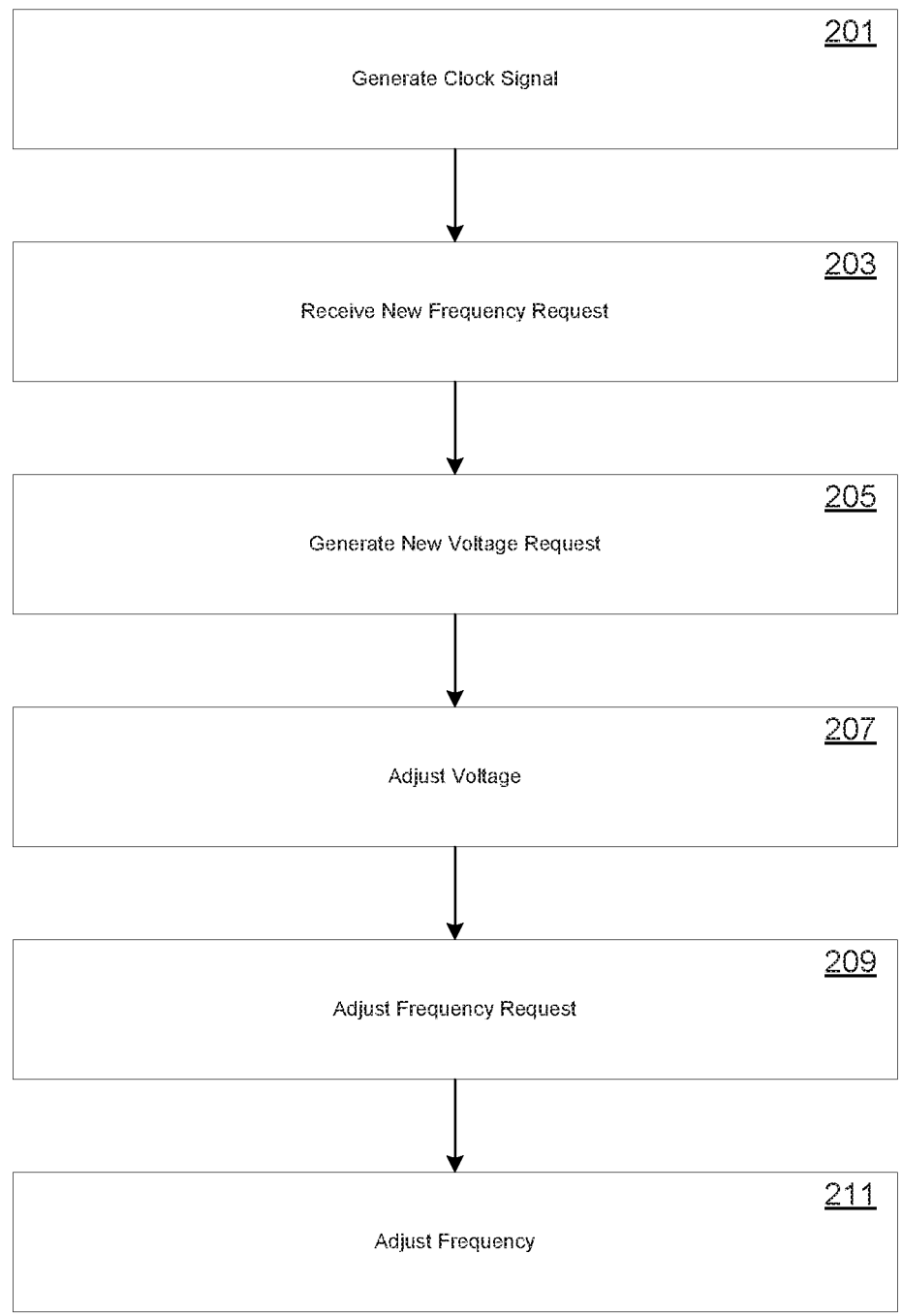
FIG. 2 depicts a flow chart of a method for performing adaptive dynamic voltage frequency scaling in an integrated circuit, in accordance with various embodiments of the present invention.

FIG. 2 depicts a flowchart 200 of an exemplary process for performing adaptive dynamic voltage frequency scaling in an integrated circuit (IC) in accordance with various embodiments of the present invention. Steps 201-209 describe exemplary steps of the flowchart 200 in accordance with the various embodiments herein described.

At step 201, a clock signal is generated. In one or more embodiments, the clock signal may be generated in a clock signal generator or noise-aware frequency-locked-loop, such as the clock signal generator 115 described above with respect to FIG. 1. In one or more embodiment, the frequency of the clock signal is self-tuning and automatically adjusts based on an input voltage provided by a voltage regulator, such as the voltage regulator 107 of FIG. 1.

At step 203, a new frequency request is received. In one or more embodiments, the new frequency request is received in a voltage requestor, implemented for example, as a comparator and proportional-integral-derivative (PID) controller that takes as input the received frequency request and a current operating frequency of the signal generated at step 201. If the new frequency request is different from the current operating frequency, a new voltage request is generated at 205. In one or more embodiments, the new voltage request is generated for the specific voltage sufficient to power the microchip or integrated circuit device.

At step 207, the voltage in the microchip or integrated circuit device is adjusted to the voltage requested in step 205. In one or more embodiments, the adjustment is performed in a voltage regulator, such as the voltage regulator described above with respect to FIG. 1. In still further embodiments, the voltage regulator may also include a power management integrated circuit. The adjusted voltage is sampled (e.g., in an analog to digital converter) and an adjusted frequency request is generated based on the new voltage and specifically adjusted to account for real-time measured operating conditions (such as temperature and age) in the chip or integrated circuit at step 209. Adjustments can also be made for process variations of the chip. Finally, the frequency in the chip or integrated circuit is thereafter adjusted (e.g., in a digital ring oscillator) at step 211 to the adjusted frequency request.

Figure 3:
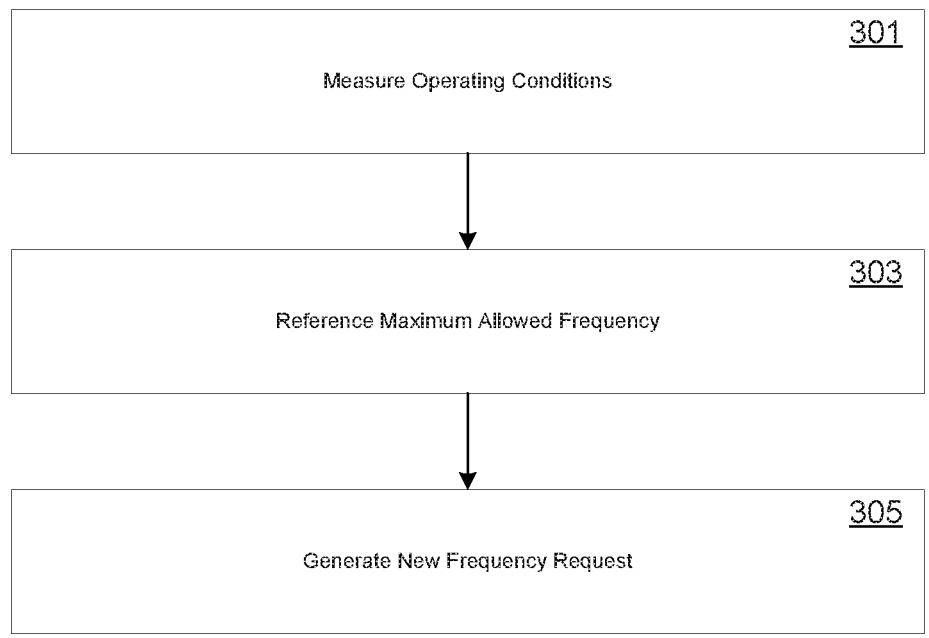
FIG. 3 depicts a flow chart of a method for adjusting a frequency request for adaptive voltage and frequency scaling, in accordance with various embodiments of the present invention.

FIG. 3 depicts a flowchart 300 of an exemplary process for generating a new frequency request in accordance with various embodiments of the present invention. Steps 301-305 describe exemplary steps of the flowchart 300 in accordance with the various embodiments herein described.

At step 301, prevailing operating conditions in a chip or other integrated circuit device are measured. In one or more embodiments, the operating conditions may include, for example, a voltage, a temperature, and/or an age in the chip or IC device and may be measured by one or more hardware or software sensors. In one or more embodiments, the operating conditions may include an analog-to-digital converter that measures the supplied voltage from a voltage regulator.

At step 303, a look-up table is referenced to determine the maximum allowed frequency that corresponds to the prevailing operating conditions. In one or more embodiments, the look-up table may be implemented as a hardware look-up table such as the look-up table 113 described above with respect to FIG. 1. Determining the maximum allowed frequency may include, for example, referencing one or more voltage-frequency curves that is adjusted to account for the equivalent operating conditions (e.g., temperature, age) and process variations of the chip.

Finally, an adjusted frequency request is generated based on the maximum allowed frequency determined in step 303. In one or more embodiments, the adjusted frequency request is supplied to a clock signal generator (such as a noise-aware frequency locked-loop) that generates a clock signal with a frequency equal to the adjusted frequency request.

Exemplary Computing Device

Figure 4:
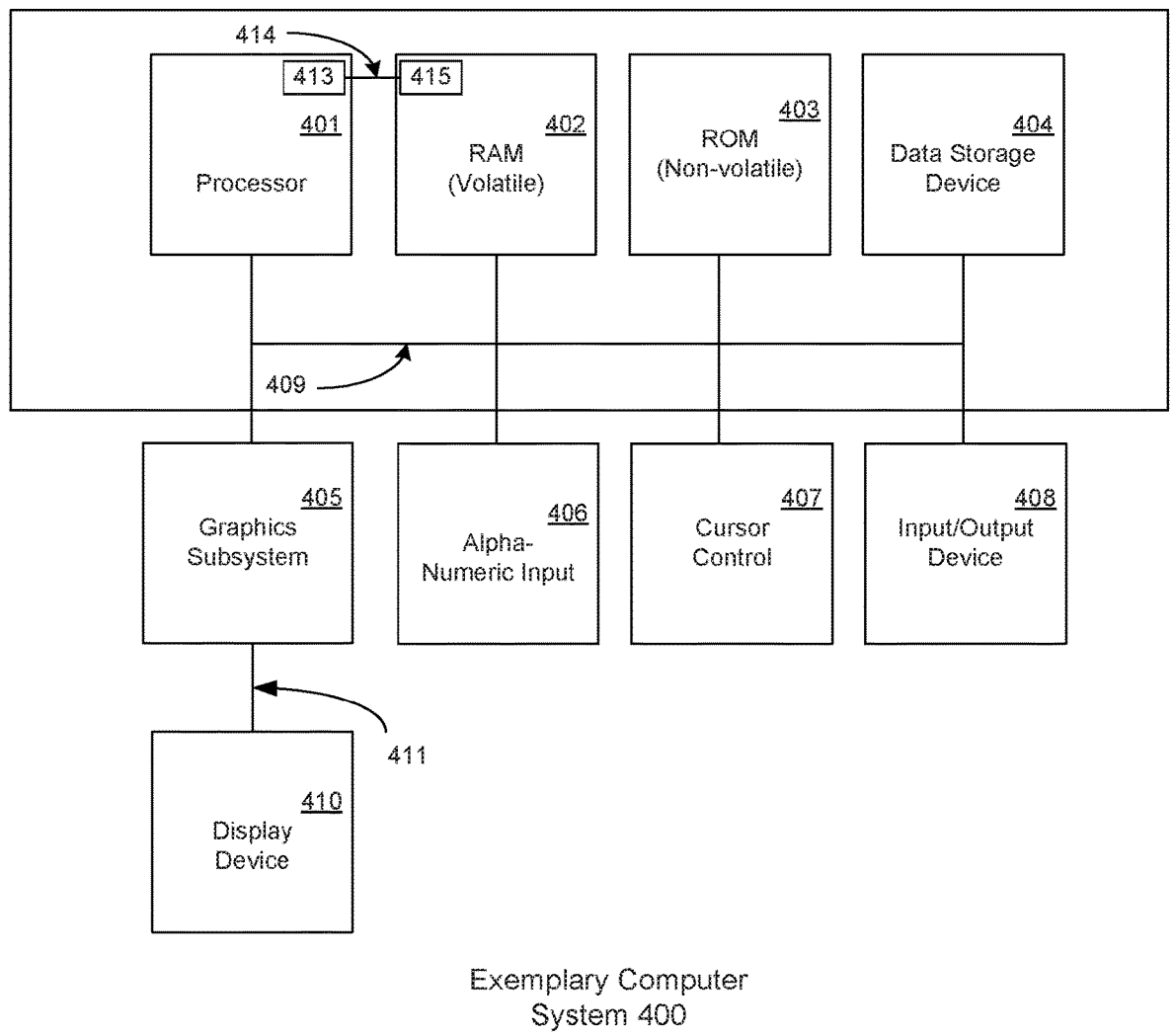
FIG. 4 depicts an exemplary computing system upon which embodiments of the present invention may be implemented, in accordance with various embodiments of the present invention.

As presented in FIG. 4, an exemplary system upon which embodiments of the present invention may be implemented includes a general purpose computing system with one or more integrated circuits, such as computing system 400. In its most basic configuration, computing system 400 typically includes at least one processing unit 401 and memory, and an address/data bus 409 (or other interface) for communicating information. Depending on the exact configuration and type of computing system environment, memory may be volatile (such as RAM 402), non-volatile (such as ROM 403, flash memory, etc.) or some combination of the two. In one or more embodiments, a frequency of the processing unit 401 may, for example, be dynamically and adaptively adjusted to correspond to noise and other process variations of a power supply (not depicted), as described above with respect to FIGS. 1-3. In one or more embodiments, the frequency of the processing unit 401 may also be dynamically and adaptively adjusted using a look-up table stored in a cache 413 of the processing unit 401, and responsive to a requested frequency 414 from software applications 415 executing in the memory (e.g., RAM 402).

Computer system 400 may also comprise an optional graphics subsystem 405 for presenting information to the computer user, e.g., by displaying information on an attached display device 410, connected by a video cable 411. According to embodiments of the present claimed invention, the graphics subsystem 405 may be coupled directly to the display device 410 through the video cable 411. A graphical user interface of an image viewing software application executing in the computer system 400 may be generated in the graphics subsystem 405, for example, and displayed to the user in the display device 410. In alternate embodiments, display device 410 may be integrated into the computing system (e.g., a laptop or netbook display panel) and will not require a video cable 411. In one embodiment, the processes 200 and 300 may be performed, in whole or in part, by graphics subsystem 405 in conjunction with the processor 401 and memory 402, with any resulting output displayed in attached display device 410.

Additionally, computing system 400 may also have additional features/functionality. For example, computing system 400 may also include additional storage (removable and/or non-removable) including, but not limited to, magnetic or optical disks or tape. Such additional storage is illustrated in FIG. 4 by data storage device 407. Computer storage media includes volatile and nonvolatile, removable and non-removable media implemented in any method or technology for storage of information such as computer readable instructions, data structures, program modules or other data. RAM 402, ROM 403, and data storage device 407 are all examples of computer storage media.

Computer system 400 also comprises an optional alphanumeric input device 406, an optional cursor control or directing device 407, and one or more signal communication interfaces (input/output devices, e.g., a network interface card) 408. Optional alphanumeric input device 406 can communicate information and command selections to central processor 401. Optional cursor control or directing device 407 is coupled to bus 409 for communicating user input information and command selections to central processor 401. Signal communication interface (input/output device) 408, also coupled to bus 409, can be a serial port. Communication interface 409 may also include wireless communication mechanisms. Using communication interface 409, computer system 400 can be communicatively coupled to other computer systems over a communication network such as the Internet or an intranet (e.g., a local area network), or can receive data (e.g., a digital television signal).

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

In the foregoing specification, embodiments have been described with reference to numerous specific details that may vary from implementation to implementation. Thus, the sole and exclusive indicator of what is the invention, and is intended by the applicant to be the invention, is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. An adaptive voltage and frequency scaling (AVFS) system comprising:

a clock signal generator configured to generate a frequency in an integrated circuit (IC);

a voltage regulator configured to control a current voltage level in the IC;

a look-up-table (LUT) configured to determine a maximum frequency available under the current voltage level in the IC; and a voltage requestor configured to compare a software-requested frequency and the maximum frequency, to determine a difference between the software-requested frequency and the maximum frequency, and to generate a new voltage request based on the difference, wherein the voltage regulator is further configured to adjust the current voltage level to substantially approximate the new voltage request in response to the new voltage request, further wherein, the clock signal generator is configured to adjust the frequency in the IC to substantially approximate the software-requested frequency in response to an adjustment in the current voltage level, wherein the LUT is configured to determine the maximum frequency based on a plurality of current operating conditions, the plurality of current operating conditions being measured using plurality of sensors; and a plurality of pulse skippers configured to modulate a frequency of the clock signal, wherein the frequency generated by the clock signal generator is adjusted by controlling an operation of the plurality of pulse skippers.

2. The system according to claim 1, wherein the plurality of sensors comprises:
an analog to digital voltage converter;
a temperature sensor; and
an aging sensor.

3. The system according to claim 2, wherein the plurality of sensors is configured to measure and update the plurality of current operating conditions in real time.

4. The system according to claim 3, further wherein the LUT is configured to update the maximum frequency based on updated current operating condition provided by the plurality of sensors.

5. The system according to claim 2, wherein the LUT comprises a plurality of voltage-frequency (VF) curves, each VF curve corresponding to at least one of a temperature in the IC and an age of the IC.

6. The system according to claim 5, wherein each VF curve comprises a VF operating margin calculated specifically for the at least one of the temperature in the IC and the age of the IC.

7. The system according to claim 1, wherein the clock signal generator comprises at least one of: a clock generator; and a noise-aware frequency locked loop.

8. The system according to claim 1, wherein the clock signal generator is configured to generate a clock signal by self-tuning a dynamic voltage-controlled oscillator.

9. The system according to claim 8, wherein the clock signal generated by the clock signal generator is prevented from exceeding the maximum frequency referenced from the LUT.

10. The system according to claim 1, wherein the new voltage request generated by the voltage requestor comprises a minimum voltage required to achieve an actual frequency requested from an application.

11. A method for performing adaptive dynamic voltage frequency scaling in an integrated circuit (IC), the method comprising:

generating a clock signal having a current frequency and a current voltage level in an IC;

receiving a new frequency request from a software application executing in a computing device comprising the IC, the new frequency request comprising a difference between a maximum allowed frequency corresponding to the current voltage level and a software-requested frequency;

generating a new voltage request based on the new frequency request, the new voltage request corresponding to a voltage level sufficient to sustain the new frequency request;

adjusting a current voltage in the IC to a new voltage that approximates the new voltage request;

adjusting the new frequency request to an adjusted frequency request based on operating conditions in the IC; and adjusting a frequency in a clock signal generator to the adjusted frequency request, wherein the frequency generated by the clock signal generator is adjusted by controlling an operation of a plurality of pulse skippers configured to modulate a frequency of the clock signal, wherein the maximum allowed frequency is determined by referencing a look-up table based on a plurality of operating conditions in the IC, the plurality of operating conditions being measured using a plurality of sensors.

12. The method according to claim 11, wherein the receiving the new frequency request comprises:
comparing the frequency request from the software application with the maximum allowed frequency; and
determining a difference between the frequency request from the software application and the maximum allowed frequency.

13. The method according to claim 11, wherein the generating the clock signal comprises generating the clock signal in a noise-aware frequency locked loop.

14. The method according to claim 11, wherein the adjusting the frequency in a clock signal generator comprises adjusting a frequency using a dynamic voltage-controlled oscillator.

15. The method according to claim 11, wherein the adjusting the frequency in the clock signal generator comprises adjusting the frequency to a new frequency that does not exceed the maximum frequency corresponding to a voltage level in the IC.

16. A method for adjusting a frequency request for adaptive voltage and frequency scaling, the method comprising:
measuring a plurality of current operating conditions in an IC;
referencing a maximum allowed frequency allowed by the IC based on the plurality of current operating conditions in response to receiving the frequency request; and
generating a new frequency request based on a frequency difference between the maximum allowed frequency and the frequency request, wherein the frequency request is generated by a software application executing in a computing device comprising the IC, the plurality of current operating conditions being measured using plurality of sensors;
wherein the plurality of sensors include:
an analog to digital voltage converter,
a temperature sensor, and
an aging sensor.

17. The method according to claim 16, wherein the referencing the maximum allowed frequency comprises referencing the maximum allowed frequency from a look-up-table, the look-up-table comprising a plurality of voltage-frequency (VF) curves.

18. The method according to claim 17, wherein the referencing the maximum allowed frequency from a look-up-table each VF curve comprises calculating a VF operating margin specifically for plurality of current operating conditions in the IC.

* * * * *

UNITED STATES PATENT AND TRADEMARK OFFICE
CERTIFICATE OF CORRECTION

| | | |
|---|---|---|
| PATENT NO. | : 10,659,063 B2 | Page 1 of 1 |
| APPLICATION NO. | : 15/340901 | |
| DATED | : May 19, 2020 | |
| INVENTOR(S) | : Tezaswi Raja et al. | |

It is certified that error appears in the above-identified patent and that said Letters Patent is hereby corrected as shown below:

In the Claims

Column 10, Line 61 please replace "using plurality" with --using a plurality--.

Signed and Sealed this
Fifteenth Day of September, 2020

Andrei Iancu
*Director of the United States Patent and Trademark Office*